United States Patent
Imaoka et al.

(10) Patent No.: US 7,560,053 B2
(45) Date of Patent: Jul. 14, 2009

(54) THERMOELECTRIC MATERIAL HAVING A RHOMBOHEDRAL CRYSTAL STRUCTURE

(76) Inventors: Nobuyoshi Imaoka, R&D Administration, 2-1, Samejima, Fuji-city, Shizuoka, 416-8501 (JP); Isao Morimoto, R&D Administration, 2-1, Samejima, Fuji-city, Shizuoka, 416-8501 (JP); Lance L. Miller, 305 Klamath Hall, 1238 University of Oregon, Eugene, OR (US) 97403-1238; Robert Schneidmiller, 305 Klamath Hall, 1253 Franklin Blvd., University of Oregon, Eugene, OR (US) 97403; David Charles Johnson, Department of Chemistry, 1253 University of Oregon, Eugene, OR (US) 97403-1253

( * ) Notice: Subject to any disclaimer, the term of this patent is extended or adjusted under 35 U.S.C. 154(b) by 178 days.

(21) Appl. No.: 11/357,738

(22) Filed: Feb. 16, 2006

(65) Prior Publication Data

US 2007/0034838 A1    Feb. 15, 2007

Related U.S. Application Data

(60) Provisional application No. 60/654,277, filed on Feb. 17, 2005.

(51) Int. Cl.
*H01B 1/06* (2006.01)
*H01L 35/16* (2006.01)

(52) U.S. Cl. ............ 252/519.4; 252/521.1; 252/62.3 T; 136/238

(58) Field of Classification Search .............. 252/518.1, 252/519.4, 521.1, 62.3 T; 136/236.1, 238
See application file for complete search history.

(56) References Cited

U.S. PATENT DOCUMENTS

| | | | | |
|---|---|---|---|---|
| 5,458,867 | A * | 10/1995 | Ritter | 423/509 |
| 5,726,381 | A * | 3/1998 | Horio et al. | 136/236.1 |
| 6,225,550 | B1 * | 5/2001 | Hornbostel et al. | 136/236.1 |
| 6,710,238 | B1 | 3/2004 | Shingu et al. | |

FOREIGN PATENT DOCUMENTS

JP    08-111546    4/1996

OTHER PUBLICATIONS

Zhao et al "Solvothermal synthesis of nano-sized LaxB1(2-x)Te3 thermoelectric powders", Inorganic Chemistry Communications 7(2004) 386-388.*

(Continued)

*Primary Examiner*—Mark Kopec
(74) *Attorney, Agent, or Firm*—Klarquist Sparkman, LLP

(57) ABSTRACT

Thermoelectric materials with a high Seebeck coefficient and a large power factor are provided. The materials are impact resistant and resistant to heat-distortion. Such materials include a rare earth element, Bi, and Te and have a rhombohedral crystal structure. In some examples, the rare earth element is selected from the group consisting of Ce, Sm and Yb. Such materials can be formed as films with a thickness of from 0.01 to 500 μm on a resin substrate. Production methods may include laminating different types of layers of thickness of 20 nm or less and heat-treating the resultant composition-modulated composite. The material may be separated from a substrate for sintering.

12 Claims, 4 Drawing Sheets

OTHER PUBLICATIONS

Hu et al "Mn15Bi34Te51 and La15Bi34Te51 thermoelectric materials by mechanical alloying", Xiyou Jinshu Cailiao Yu Gongcheng (2002, 31(4), 287-290 (Abstract Only).*

Maksudova et al "Thermoelectric properties of the compounds ytterbium bismuth telluride (YbBi2Te4, YbBi4Te7) and the solid solutions bismuth susquitelluride-ytterbium monotelluride", Izvestiya Akademii Nauk SSSR, Neorganicheskie Materialy (1988), 24(8), 1394-4 (Abstract Only).*

P. G. Rustamov et. al., "Electrophysical Properties of $CeBiTe_3$," Physica Status Solidi A: Applied Research 86:113-115 (1984).

P. G. Rustamov et. al., Zhurnal Neorganicheskoi Khimii 24:764-766 (1979), No English Abstract or Translation.

X.H.Ji et al., "Synthesis and properties of rare earth containing $Bi_2Te_3$ based thermoelectric alloys," Journal of Alloys and Compounds 387:282-286 (2005).

* cited by examiner ns a heat engine such as a factory, a power plant
THERMOELECTRIC MATERIAL HAVING A RHOMBOHEDRAL CRYSTAL STRUCTURE

CROSS REFERENCE TO RELATED APPLICATIONS

This application claims the benefit of U.S. Provisional Patent Application No. 60/654,277, filed Feb. 17, 2005, which is hereby incorporated herein by reference.

TECHNICAL FIELD

The present invention relates to a thermoelectric material that can be used in a temperature range of from about −50° C. to about 100° C. Such materials can be used for a cooling system and a temperature controller based on a Peltier effect, as a power generator for generating electricity based on a Seebeck effect, a thermocouple and a temperature sensor based on a thermoelectromotive force, and the like. Methods for manufacturing the thermoelectric materials are also disclosed.

BACKGROUND

When different types of semiconductors are connected to form an electric circuit and direct current is applied, heat is produced at one junction and heat is absorbed at the other junction. This phenomenon is called the Peltier effect. Electronic cooling of a target using the Peltier effect is called thermoelectric cooling, and devices that provide such cooling are referred to as thermoelectric coolers or Peltier coolers. Further, if there is a temperature difference between two junctions, an electromotive force is generated in proportion to the temperature difference. This phenomenon is called the Seebeck effect, and power generation using such generated electromotive force is called thermoelectric power generation. In addition, a temperature sensor called a thermocouple senses a temperature difference between two junctions based on a junction between two metals that is included in an electric circuit. Measuring the thermoelectromotive force between two junctions permits temperature determination. In addition to the thermocouple, a variety of sensors based on the Seebeck effect include a device, a module, or a system for obtaining a change in a quantity of intensive property (intensity variable) by sensing the temperature difference by a potential difference, the change having one-to-one correspondence with a temperature difference, and for giving feedback to a variety of functions. Such an element having a basic configuration for connecting a different type of metal or a semiconductor is generally called a thermoelectric element, and metal or a semiconductor used for the element with a high thermoelectric performance is called a thermoelectric material.

Since thermoelectric cooling is a cooling by a solid element, it is characterized in that no toxic refrigerant gas is necessary, no noise occurs, and partial cooling is possible. In addition, because heating is possible in a Peltier effect device by switching a direction of current, temperature can be regulated with accuracy. Typical applications include cooling and precise temperature regulation of electronic components and temperature control of storage cabinets such as wine coolers in which temperature control is important. When a thermoelectric material with high performance is used at room temperature or below, it is possible to achieve a refrigerator, a freezer and a seat cooler without using any toxic gas such as a CFC. Meanwhile, thermoelectric power generation realizes effective use of energy that includes power generation using waste heat from a heat engine such as a factory, a power plant and a vehicle, power generation using abundant solar energy, a wearable device such as a thermoelectric power generation watch using a temperature difference between a body and outside air, or the like. Further, a thermoelectric material with large thermoelectromotive force and a small resistance has a high usage value as a temperature sensor such as a thermocouple having a high sensitivity.

Although a bulk material is often used for the above applications, application of a thin film type Peltier element is expected for the cooling and temperature regulation of small parts. For example, a CPU or the like has a problem of performance reduction in computing speed and the like due to a temperature increase of a semiconductor element during operation associated with higher speed and performance and a smaller size and thickness of the element. A thin film type of a thermoelectric cooling element with a thickness of 500 μm or less and high performance is required for cooling such a part. An important problem particularly in this application is to transport heat generated in components to the outside as quickly as possible, thereby maintaining the temperature of components to prevent a temperature increase. Therefore, performance such as a power factor to be described below may be regarded as important in a thin film type material other than a figure of merit demanded of a bulk material.

High performance of a thermoelectric element is generally indicated by a fact that any one of thermoelectromotive force (V), a Seebeck coefficient ($\alpha$), a Peltier coefficient ($\pi$), a Thomson coefficient ($\tau$), a Nernst coefficient (Q), an Ettingshausen coefficient (P), electrical conductivity ($\sigma$), a power factor (PF), a figure of merit (Z), and a dimensionless figure of merit (ZT) is high, or any one of thermal conductivity ($\kappa$), a Lorentz number (L), and electrical resistivity ($\rho$) is low.

Particularly, a dimensionless figure of merit (ZT) is indicated by $ZT=\alpha^2\sigma T/\kappa$ (here, T indicates an absolute temperature) and is an important element for determining efficiency of thermoelectric conversion energy such as a coefficient of performance in thermoelectric cooling and conversion efficiency in thermoelectric power generation. Therefore, it is possible to increase efficiency of cooling and power generation by using a thermoelectric material with a large figure of merit ($Z=\alpha^2\sigma/\kappa$) to form a thermoelectric element.

Namely, a thermoelectric material preferably has a large Seebeck coefficient ($\alpha$), a large electrical conductivity ($\sigma$), therefore a large power factor ($PF=\alpha^2\sigma$) and a small thermal conductivity ($\kappa$). Moreover, in other words, a material preferably has a large Seebeck coefficient ($\alpha$) and a large ratio $\sigma/\kappa (=1/TL)$ of an electrical conductivity to a thermal conductivity.

In the application for thermoelectric power generation, a material having a large power factor as well as a large figure of merit may be required. A performance index (Z) is a value obtained by dividing a power factor ($PF=\alpha^2\sigma$) by a thermal conductivity ($\kappa$). When $\kappa$ is small, a figure of merit is increased as for the same power factor. However, when $\kappa$ is too small, since an element is inserted in a part having a temperature difference, a thermal resistance rises, resulting in a large system and increased capital and operating costs. See, for example, Yamaguchi et al., Thermoelectric Conversion Symposium, Tokyo, Aug. 6, 1999, Tokyo, at 44.

As a material used for a variety of sensors, an absolute value of the Seebeck coefficient of at least 50 μV/K at room temperature is needed for increased measurement sensitivity and precision. A metallic thermoelectric material such as copper-constantan ($\alpha$ is about −50 μV/K at room temperature), Alumel-Chromel, and platinum platinum-rhodium is usually used. However, since these are made of precious metals or use multicomponent alloys, the material and manufacturing costs are high.

Most of the materials conventionally used as thermoelectric elements are multicomponent semiconductor materials doped with various materials in a crystal structure of a $Bi_2Te_3$ system. On the other hand, some of the materials, called strongly corrected 4f electron materials that contain rare earth elements such as $YbAl_3$, $CePd_3$ and CeRhAs, show high thermoelectric properties in a temperature region lower than room temperature. Although they are useful at low temperatures (10 to 200 K), good properties have not been achieved around room temperature. There have been efforts to prepare a material with high performance at room temperature or below by adding a rare earth element such as Ce, Sm or Yb which is an essential component in the 4f electron material to a $Bi_2Te_3$ crystal. Although properties of such a material may attract interest, such a material is not sufficiently investigated. P. G. Rustamov et. al., Physica Status Solidi A: Applied Research (1984) 86 (2), K113-K115, describes a $CeBiTe_3$ ($Ce_{20}Bi_{20}Te_{60}$) material having a hexagonal crystal structure, but having poor oxidation resistance since a large amount of rare earth elements is added. Furthermore, although the observed value of electrical conductivity is unknown, this material is said to show a semiconductor-type change of electrical conductivity with temperature. Therefore, based on the change of the Seebeck coefficient with temperature, it can be expected that this material is suitable for high temperature applications at 400 K or higher.

An example of preparing a $Ce_2Te_3$—$Bi_2Te_3$ solid solution in a region where the solid solubility of $Ce_2Te_3$ is low has been reported in P. G. Rustamov et. al., Zhurnal Neorganicheskoi Khimii, (1979), 24(3), 764-766), although this material is not regarded as a thermoelectric material. According to this report, thermodynamically stable hexagonal $CeBiTe_3$ is a stoichiometric intermetallic compound, and it is unlikely that a non-stoichiometric solid solution can be formed with a similar composition. In addition, from a phase diagram reported in the above paper, it can be understood that $Ce_2Te_3$ has an upper limit of the solid solubility of 3 mol % based on $Bi_2Te_3$ at room temperature in a thermodynamically stable phase. However, there is no report in the foregoing literature on a material which has a non-stoichiometric ratio of the sum of the content of Bi and Ce to the content of Te.

An amorphous or slightly crystalline R—Bi—Te material is disclosed in Japanese Patent Laid-Open No. 08-111546. Since this material is not a highly crystalline material, it has poor stability to thermocycling, variation with time and the like. In addition, the report describes that it has a low electrical conductivity. Accordingly, this material will have a poor power factor and thus will have disadvantageous features for applications such as thin film type thermoelectric materials and thermoelectric power generation.

A thermoelectric power generation element generates power using a temperature difference between a higher temperature side and a lower temperature side, and a thermoelectric cooling element generally functions by the heat transferred by electric current from a lower temperature side to a higher temperature side. Therefore, these elements are each inserted into a part with different temperatures. Accordingly, a difference in thermal expansion appears between a lower temperature side and a higher temperature side, creating a thermal shear-stress in an element. Occurrence of the shear stress reduces the life of a thermoelectric semiconductor element by thermocycling. For some applications, a thermoelectric semiconductor material composed of a melted polycrystal or a sintered-compact powder has been used which has a relatively high shear stress without cleavability, and various connections and element structures have been proposed. However, these may have insufficient alignment compared with a single crystal, reducing thermoelectric performance to be expected, and special connection methods may limit usage thereof. A thermoelectric material which can satisfactorily endure the above described thermal shear-stress has not yet been found.

An object of the present invention is to provide a thermoelectric material which can be expected to have high performance as a thermoelectric element, that is, which has a high Seebeck coefficient ($\alpha$) and a high a power factor (PF), when used in a temperature region of from −50° C. to 100° C. Another object of the present invention is to provide a thermoelectric material for thermoelectric power generation or a thermoelectric element for thermoelectric cooling which has solved the above described various problems caused by brittleness of a thermoelectric semiconductor and has a satisfactory figure of merit (ZT).

SUMMARY

Non-stoichiometric thermoelectric materials are provided that can be represented by the general formula: $R_xBi_y$ $Te_{(100-x-y)}$. R denotes at least one element selected from a group of rare earth elements including Y, and x and y each denote percentage composition by mole such that $0.05 \leq <20$ and $20 \leq y \leq 75$. A main phase of these materials has a substantially rhombohedral crystal structure. Generally, R denotes at least one rare earth element selected from Y, La, Ce, Pr, Nd, Pm, Sm, Eu, Gd, Tb, Dy, Ho, Er, Tm, Yb and Lu. R is preferably at least one of Ce, Sm and Yb. More preferably, R is at least one of Ce and Yb.

The elements Ce, Sm and Yb in compounds generally form a trivalent ion, wherein the number of electrons in the 4f orbital is 1, 5 and 13, respectively. However, since the energy level of $4f^1$ in $Ce^{3+}$ and $4f^{13}$ in $Yb^{3+}$ is close to the Fermi level and the energy of the electronic states of $Sm^{3+}$ and $Sm^{2+}$ are almost equal, the trivalent ionic states of these three elements are unstable in comparison with the trivalent ionic states of other rare earth elements. Accordingly, the 4f state of $Ce^{3+}$, $Yb^{3+}$ and $Sm^{3+}$ easily make a hybrid with conduction electrons, resulting in a slight mixture of tetravalency with trivalency (Ce) and divalency with trivalency (Sm, Yb). This c-f hybridized effect tends to lead to induce a giant thermoelectric power specific to a strongly corrected material by causing to lose magnetic moment of rare earth ions through the Kondo effect. As described above, Ce, Sm and Yb each can increase the Seebeck coefficient by the effect of 4f electrons compared with other elements. Particularly, when either Ce, in which one electron exists in the 4f orbital, or Yb, in which one hole exists in the 4f orbital, is used, the c-f hybridization is easily attained, and the superior thermoelectric performance is achieved.

The content of R in a thermoelectric material ranges from 0.05 molar percent to less than 20 molar percent. Materials with R of less than about 0.05 molar percent tend to exhibit a small Seebeck coefficient ($\alpha$) in a temperature range around room temperature, and adding a rare earth element has little effect. When R increases above 20 percent by mole or higher, the crystal structure of a main phase changes to a crystal structure other than the rhombohedral that is suitable for a thermoelectric material. In addition, such materials are easily oxidized, and are not durable. For thermoelectric materials containing La or Ce, molar percentages should be less than about 20 percent by mole to avoid oxidation.

The crystal structure of a main phase of the disclosed thermoelectric materials is rhombohedral (similar to that of $Bi_2Te_3$). As used herein, a main phase of a material refers to a portion of a material that occupies greater than or equal to 50% or more of the total volume of the material.

The content of Bi in a thermoelectric material of the present invention is between about 20 percent by mole and 75 percent by mole. When the Bi content is less than 20 percent by mole, the main phase is generally not rhombohedral crystal structure, and such materials are associated with a reduced Seebeck coefficient ($\alpha$). When the Bi content exceeds 75 percent by mole, both electrical conductivity and Seebeck coefficient are reduced.

Generally up to 80% of Bi may be replaced with Sb and up to 50% of Te may be replaced with Se. However, for superior thermoelectric performance around room temperatures, both Sb and Se preferably replace less than about 50% of Bi and Te, respectively. When more than 80% of Bi is replaced with Sb, thermal conductivity decreases and electrical conductivity increases, and the Seebeck coefficient is reduced. Similarly, when more than 50% of Te is replaced with Se, thermal conductivity decreases and electrical conductivity increases, and the Seebeck coefficient is reduced.

R—Bi—Te-based thermoelectric materials have substantially rhombohedral crystal structures. $Sb_2Te_3$ and $Bi_2Se_3$ also have a rhombohedral crystal structure. Accordingly, these three materials can form an all proportions solid solution with each other, Bi can be replaced with Sb, and Te can be replaced with Se as described above without crystal structure changes. To reduce thermal conductivity without reducing electrical conductivity, solid solutions with a composition of an R—Bi—Te+$Sb_2Te_3$ solid solution for P-type and an R—Bi—Te+$Bi_2Se_3$ solid solution for N-type can be formed. Furthermore, to further reduce thermal conductivity, a solid solution may be formed by mixing three phases of R—Bi—Te, $Sb_2Te_3$ and $Bi_2Se_3$.

A thermoplastic material of the present invention may include I, Br, Li, Al, AgI, CuBr, $Cu_2S$, $HgCl_2$, $HgBr_2$, $HgI_2$, $SbI_3$, Ag, Au, Ge, Pb, Cd, Zn, Cs, S and the like. In addition, such a material may include an element with a low melting point of less than 800° C. such as Sn, In, Ga, As and the like, or a compound thereof. However, the total amount thereof is preferably 10 percent by mole or less of a thermoelectric material of the present invention, and preferably 5 percent by mole or less. When it exceeds 10 percent by mole, the effect for an improved carrier density, a reduced thermal conductivity and the like is saturated, while a Seebeck coefficient ($\alpha$) and a dimensionless figure of merit (ZT) are reduced. When an additive with a melting point of 800° C. or higher is to be dissolved in a main phase for doping, solid solutions with Bi—Te may be difficult to form, and so a special production method described below may be used. Melting points of rare earth elements are 800° C. (Ce), 824° C. (Yb), 1,072° C. (Sm), and are between 800-1,661° C. for all rare earth elements.

A solid substance with a spatially periodical atomic arrangement is called a crystal, and a part that is crystalline is referred to as a crystal phase. The main phase of a disclosed thermoelectric material has a rhombohedral crystal structure and is composed of a crystal phase in 50% by volume or more thereof. Such a thermoelectric material has a higher electrical conductivity and higher thermoelectric performance when the material has higher crystallinity. Thus, higher crystallinity is preferable. Higher crystallinity of a thermoelectric material means that the material has few defects. Such a thermoelectric material is composed of a crystal phase with high crystallinity, that is, a periodic atomic arrangement with few disorders on a microscopic scale and that the area of grain boundaries per unit volume is small since a grain boundary represents a crystallinity disorder. Therefore, an average grain size of the crystal phase is preferably 1 μm or more.

An average grain size depends not only on a material thickness, but also the area of a plane perpendicular to a thickness direction, since it is a parameter reflecting volume and shape as described below. For example, in the case of a material as an embodiment of the present invention which is a thin film with a thickness of from 0.01 μm to less than 1 μm and forms a continuous layer, the average grain size of a crystal phase is determined by observing the grain boundary on a plane, measuring the longitudinal and lateral dimensions of an area divided by the grain boundary and averaging the measurements. Therefore, within the scope of the present invention, a crystal of 1 μm square viewed from a thickness direction is considered to have a crystal grain size of about 1 μm, regardless of the thickness. Such an assessment of a crystal grain size is useful because the variations in a regular atomic arrangement in a direction of electric current or heat of flow can be significant in determining thermoelectric performance, since thermoelectric performance is closely related with transport phenomenon.

A method for determining the crystal grain size of a material with a continuous layer will be described below. A scanning electron microscope (SEM) is used to observe more than ten crystal grains in each of three fields of view or more for determining each grain size. The grain size is preferably determined by the Heine method. Specifically, according to the principle thereof, an average of a length in the direction of a horizontal axis and a length in the direction of a perpendicular axis for one crystal grain is regarded as the grain size of the crystal grain. The grain sizes of each of the grains as determined according to the above described procedure are arithmetically averaged to provide an average grain size. A powder-like material of the present invention is often in the form of fillers, whose photograph shows a thin thickness. However, when the grain size of a powder-like material is determined, a method is adopted in which an average of a length in the direction of a horizontal axis and a length in the direction of a perpendicular axis is regarded as the grain size, according to the case of a continuous layer, based on an image of powder which is the projection of the powder onto a two-dimensional photographic plane in a photograph of the powder. The number of fields of view and the number of measurement of crystal grains are similar to those in the case of the continuous layer as described above. Since the lower limit of the crystal grain size is naturally lower than the average value of these grains, it may be determined whether the crystal grains have sufficient crystallinity or not by the fact that the crystal grains have a lower limit of a grain size of 1 μm or more. However, it is necessary to verify by any of certain methods that each of the above described ground particles be a single-crystal grain. One of the methods includes a method in which it is verified that an original ground particle is substantially a single crystal by determining high alignment of a shaped product formed by a sintering method or the like of powder-like grains.

A thermoelectric material of the present invention preferably has a crystal-phase size controlled to 1 μm or more and a grain-boundary area per unit volume of a specific value or less, and in addition to the above preferably has a higher crystallinity of a crystal phase. The half-value width of each diffraction line in X-ray diffraction is an index that largely depends on the size and crystallinity of a crystal phase. The larger the crystal grain size of a crystal phase is and the higher the crystallinity of a crystal phase is, the more the value is reduced, that is, the sharper the diffraction line is. This leads to a determination that the thermoelectric material has high crystallinity. When a thermoelectric material of the present invention is subjected to measurement of a crystal phase by X-ray diffraction under standard conditions as described below, it is preferable that the thermoelectric material be a material with high crystallinity in which the strongest line in diffraction lines has a half-value width of 0.5° or less. More preferably, the strongest line in diffraction lines has a half-value width of 0.3° or less. Conditions of the X-ray diffraction are as follows: use of CuKα line, voltage/current of 40 kV/200 mA, divergence slit of 1°, scattering slit of 1°, receiving slit of 0.15 mm, scan speed of 2°/min, scan step of 0.02°, scan axis of 2θ/θ, and scan range of 2θ=5-100°. In the present invention, the strongest line in the diffraction lines refers to a diffraction line with the strongest intensity in the above described scan range of 2θ=5-100.

Within the compositional range of the present invention, a large amount of amorphous parts particularly reduces electrical conductivity, resulting in reduction of thermoelectric performance including ZT. In one of the production methods of the present invention, an evaporated multilayer film is once brought into an amorphous state before subjected to recrystallization. When it is intended to use the film as a thermoelectric material as it is in an amorphous state, electrical conductivity is extremely reduced, resulting in an unusable state. This fact also indicates that the material of the present invention is a material which is in a state entirely different from an amorphous state. When materials are compared in the same composition, it is apparent that thermoelectric performance is significantly improved by crystallizing a material from an amorphous state.

A thermoelectric material of the present invention has a main phase of a rhombohedral crystal structure, and a crystal shape thereof intrinsically anisotropic, thereby providing anisotropy to thermoelectric performance thereof. Specifically, a variety of thermoelectric performance has different performance values between, for example, a direction of (111) and (222), that is, the c-axis direction in terms of hexagonal crystal system and, for example, a direction of (−110), that is, the c-plane direction (=the direction perpendicular to the c-axis) in terms of hexagonal crystal system. Hereinafter, the c-axis direction in terms of hexagonal crystal system of the material of the present invention is referred to as the uniaxial direction, and the direction perpendicular to the c-axis, that is, the c-plane direction is referred to as the in-plane direction. Generally, a Seebeck coefficient (α) shows little change depending on the direction of a crystal. However, a thermal conductivity (κ) has a smaller value in the uniaxial direction ($κ_{//}$) than in the in-plane direction ($κ_⊥$), while an electrical resistivity (ρ) has a smaller value in the in-plane direction ($ρ_{195}$) than in the uniaxial direction ($ρ_{//}$). The extent of the difference is larger in the case of an electrical resistivity than in the case of a thermal conductivity ($κ_{//}/κ_⊥ > ρ_⊥/ρ_{//}$). As a result, a figure of merit (Z) is often larger in the in-plane direction. Accordingly, it is often advantageous to flow electric current in the in-plane direction for cooling, and to provide a temperature difference in the same direction for utilizing it in power generation or the like. When electric current is passed to transfer heat from one side to another side in a thermoelectric element, the direction is referred to as the direction of heat flow. Similarly, when a temperature difference is provided from the outside, the direction from a higher-temperature side to a lower-temperature side is also referred to as the direction of heat flow. Specifically, when a material of the present invention with higher thermoelectric performance in the in-plane direction is used as a thermoelectric element, the thermoelectric performance is naturally higher in the case when the material is used with the direction of heat flow aligned with the in-plane direction than in the case when the directions are not aligned.

As described above, a material of the present invention has a crystal with anisotropy, which provides a better thermoelectric material when it is used provided with alignment in a specific direction. Therefore, when an anisotropic powder raw material prepared by a specific method is subjected to a production method of powder metallurgy to form a polycrystalline material, it is important to align the direction of crystals utilizing an outside force field. The alignment of crystals in a material of the present invention preferably has an index of alignment A [=I(222)/I(−110)] of 10 or more, in one or more planes. When the index of alignment A is 10 or more, the thermoelectric performance of a material of the present invention is more effectively developed.

The index of alignment A is defined as a ratio of the intensity of the diffraction line derived from (222) (2θ=around 15-20°) to the intensity of the diffraction line derived from (−110) (2θ=around 40-45°), in an X-ray diffraction pattern for a plane in the direction of heat flow or in the direction perpendicular to it, when a material of the present invention is used as a thermoelectric element. A standard X-ray diffraction pattern is necessary to determine the index of alignment, and conditions for the measurement is the same as the case of X-ray diffraction for determining the above described "half-value width of a diffraction line".

A thermoelectric material of the present invention may be a thin film with a thickness of from 0.01 µm to 500 µm. When the thickness is less than 0.01 µm, the thermoelectric material will not have sufficient crystallinity. When it is intended to form a thin film with a thickness of more than 500 µm, a conventional technology for producing thin films will have poor production efficiency. A more preferred thickness range of a thin film is from 0.1 µm to 200 µm. Particularly, the thin film is preferably formed on a resin substrate. A resin substrate according to the present invention includes a substrate prepared by laminating resin in a thickness of 1 nm to 10 mm on metal or an inorganic substance, and a substrate surface-treated with a surface modifier such as an organometallic compound or a coupling agent with an organic side chain.

Materials for resin substrates include at least one or more materials selected from thermoplastic and thermosetting resins such as thermoplastic resins such as polyamide resins such as 12-nylon, 6-nylon, 6,6-nylon, 4,6-nylon, 6,12-nylon, amorphous polyamide and semi-aromatic polyamide, polyolefin resins such as polyethylene and polypropylene, polystyrene resins, polyvinyl resins such as polyvinyl chloride, polyvinyl acetate, polyvinylidene chloride, polyvinyl alcohol and an ethylene-vinyl acetate copolymer, acrylic resins such as an ethylene-ethyl acrylate copolymer and polymethylmethacrylate, acrylonitrile resins such as polyacrylonitrile and an acrylonitrile/butadiene/styrene copolymer, polyurethane resins, fluorine resins such as polytetrafluoroethylene, synthetic resins referred to as an engineering plastic such as polyacetal, polycarbonate, polyimide, polysulfone, polybutylene terephthalate, polyarylate, polyphenyleneoxide, polyethersulfone, polyphenylsulfide, polyamide-imide, polyoxybenzylene and polyetherketone and liquid crystal resins such as all aromatic polyesters; thermosetting resins such as conductive polymers such as polyacetylene, an epoxy resin, a phenolic resin, an epoxy-modified polyester resin, a silicone resin and a thermosetting acrylic resin; and elastomers such as a nitrile rubber, a butadiene-styrene rubber, a butyl rubber, a nitrile rubber, a polyurethane rubber and a polyamide elastomer.

A conventional $Bi_2Te_3$-based material is very brittle and has a weak thermal-shear stress. However, when it is fixed to a resin material as described above, it can be provided with excellent impact resistance, wherein application of mechanical and/or thermal impact does not produce cracking or chipping. FIG. 8 shows an embodiment of a thermoplastic material of the present invention, which is composed of an R—Bi—Te-based thermoelectric material 1 of the present invention and a resin substrate 2. In FIG. 8, a plurality of laminates each composed of a thin-film thermoelectric material and a resin substrate material are repeatedly laminated to constitute a thermoelectric element with the upper and lower sides of the figure being the direction of heat flow (generally, electrodes are stuck to the upper and lower parts of the figure). Thus, the in-plane direction of a material of the present invention which has high thermoelectric performance in the in-plane direction can be aligned with the direction of heat flow. Furthermore, when the thermoelectric element is applied to thermoelectric power generation, thermoelectromotive force and efficiency of power generation are improved, because a low thermal conductivity in the entire element and a resultant sharp temperature gradient allow a large temperature difference to be set in the element.

Such a thermoelectric element with a high temperature gradient can stably generate power using only a slight temperature difference between a body and outside air. If it is used, incorporated into an electronic circuit, a wearable and independent device that requires no power source can be obtained. Use of a thermoelectric material of the present invention makes it possible to devise various application products highly compatible with the coming mobile society.

Engineering plastics and thermosetting resins are suitable for heat resistant applications, and they may contain elastomers particularly when impact resistance is required.

Moreover, when a thermoelectric material formed on a resin is removed from a substrate for use, a method is suitable in which the resin is dissolved with a solvent. Since a large load needs not be applied to the material in this method, properties of a thermoelectric material are not changed by releasing it. A resin substrate for such applications includes acrylic resins such as polymethylmethacrylate, polystyrene resins, polyvinyl resins such as polyvinyl alcohol. A solvent can be appropriately selected according to the type of a resin and a thermoelectric material. For example, when polymethylmethacrylate is used for a substrate, acetone is used as a solvent therefor in a preferred method with high production efficiency.

Even when the above described resin substrate is a substrate prepared by laminating resin at a thickness of 1 nm to 10 mm by application, coating or the like on metal or an inorganic substance or a substrate surface-treated with a surface modifier, impact resistance, heat resistance, solvent-induced release properties and the like, which are the effect of the above described resin substrate, will be exerted. The above described substrate of metal or an inorganic substance includes metal and a semiconductor inorganic substance such as a stainless steel plate, an aluminum plate, a copper plate, a silicon wafer and a GaAs substrate; oxides such as sapphire and $SiO_2$; carbides such as SiC; and nitrides such as SiN. Particularly, a substrate material with a high surface flatness is suitably used.

The present invention provides a method for producing a thermoelectric material, characterized by heating a modulated composite formed on a substrate surface in a temperature range of from 50° C. to 585° C. to allow a reactant layer to react, wherein the modulated composite comprises at least two repeat units; each repeat unit comprises at least two laminated reactant layers; each repeat unit contains R, Bi and Te, wherein the total sum of the content of R, Bi and Te is 90 percent by mole or more of the whole repeat unit; and each reactant layer has a thickness of from more than 0 nm to 20 nm.

This production method is referred to as an amorphous-nucleation method. The origin of this name will be understood by the description to follow. A related method is described in U.S. Pat. No. 5,186,766.

A modulated composite of the present invention is formed on a substrate surface. The substrate may include the above described substrate of metal or an inorganic substance and a resin substrate. The modulated composite comprises at least two repeat units, and each repeat unit comprises at least two laminated reactant layers. The number of repeat is determined according to a target thickness of a thin-film material and is generally within a range of from 2 to 1,000,000.

Each repeats unit contains R, Bi and Te. Specifically, the two or more reactant layers composing one repeat unit may be as described below. Each of R, Bi and Te may form a layer of a single element. Alternatively, at least one in the above described three elements (R denotes at least one element selected from a group of rare earth elements including Y, which is a generic name of a mixture consisting of a maximum of 16 elements. When R is referred to, it shall be collectively counted as one element. For example, when the term "R, Bi and Te" is referred to, the total number of the types of elements shall be counted as three, as it will be hereinafter.) is contained as a component in a mixture layer. In the latter case, although there may be a layer containing none of the three, all of R, Bi and Te must be contained in the above described one repeat unit.

Examples of the reactant layers include an R single layer, a Bi single layer, a Te single layer, an Sb single layer, a Se single layer, a Bi—Sb layer, a Se—Te layer, an R—Bi compound phase, a Bi—Te amorphous phase, an R—Bi—Sb amorphous phase and the like.

A typical example of a modulated composite includes a modulated composite in which three reactant layers laminated in the order of an R layer, a Bi layer and a Te layer form one repeat unit, and a plurality of the repeat units are laminated to form a modulated composite. Moreover, another combination includes a repeat unit composed of two layers, that is, a reactant layer composed of an R—Bi mixture and a reactant layer composed of a Te single layer. One repeat unit may contain two or more layers of the same composition, such as a repeat unit composed of four reactant layers of a Bi layer- an R layer- a Bi layer- a Te layer. Furthermore, a case is also acceptable where a repeat unit contains four reactant layers of an R layer- a Bi layer- an Sb layer- a Te layer, in which there exists an Sb layer that contains none of R, Bi and Te in the reactant layers. Here, "modulated" in "modulated composite" expresses a local and periodical micro-variation of composition.

The sum of the content of R, Bi and Te contained in each repeat unit must be 90 percent by mole or more of the whole repeat unit. The remaining 10 percent by mole or less may include I, Br, Li, Al, AgI, CuBr, $Cu_2S$, $HgCl_2$, $HgBr_2$, $HgI_2$, $SbI_3$, Ag, Au, Ge, Pb, Cd, Zn, Cs and S, and further a low melting point element or compound with a melting point of less than 800° C. such as Sn, In, Ga and As. Furthermore, 10 percent by mole or less of an element or compound other than the above described elements or compounds may be acceptable if a main phase can remain rhombohedral. Such a component contained in an amount of 10 percent by mole or less in a thermoelectric material of the present invention other than R, Bi and Te is referred to as an "M component."

In a thermoelectric material of the present invention, 80 percent by mole of Bi may be replaced with Sb, and 50 percent by mole of Te may be replaced with Se.

A method for forming a reactant layer in a modulated composite includes known methods such as a vacuum evaporation method, a sputtering method, a MBE (Molecular Beam Epitaxy) method, a CVD method, a MOCVD method, a laser flash method and a laser ablation method. In order to prepare each reactant layer with a uniform thickness over a large area, a method for forming a film by rotating a substrate is preferred. Moreover, when the thickness of each reactant layer is set to a specific value in the alternate film-forming of multiple elements, or when any reactant layer is formed by making a composite in any proportion of multiple elements, conditions can be controlled by arbitrarily regulating the open-close time of a shutter attached to a deposition source.

A method for forming a mixture layer of two elements or more includes the above described method by controlling the open-close time of a shutter, and co-evaporation or co-sputtering by using a solid solution or an intermetallic compound as a target or by combining a plurality of targets. As an example of preparing one reactant layer using a mixture of two or more elements, there will be described a method for preparing a modulated composite in which a repeat unit is composed of two reactant layers, that is, a reactant layer composed of an R—Bi mixture and a reactant layer composed of a Te single element. A vacuum evaporator provided with three deposition sources of R, Bi and Te is made available. First, shutters for heated deposition sources of R and Bi are opened to simultaneously evaporate R and Bi on a substrate. A shutter provided in a deposition source of Te is closed during the evaporation so that Te is not evaporated on the substrate. Next, shutters provided in deposition sources of R and Bi are closed, and a shutter for a heated deposition source of Te is opened to evaporate a layer of a Te single element on an R—Bi layer. Formation of one repeat unit is completed in this manner, and a desired modulated composite is obtained by repeating the process.

In the present invention, a modulated composite obtained as described above can be heat-treated to allow a reactant layer to react. First, a reaction process of each reactant layer by heat treatment will be described below.

In a material of the present invention, the whole of the material is brought into an amorphous state by interdiffusion of a reactant in each reactant layer. Subsequently, nucleation is created in a part of the material, from where a crystal phase is grown, resulting in final formation of crystal phase over the whole material. After the amorphous state is induced, nucleation and crystallization may be induced at the same temperature as in the amorphous state, or the temperature may be raised after the amorphous state is created in order to quickly induce the nucleation.

A production process by an amorphous-nucleation method is characterized in that it includes two or more processes. However, heat treatment under different conditions by clearly separating the process into two steps, the amorphous step and the nucleation step, is not absolutely essential as described above. It is industrially desirable to study a scheme in which heat treatment process is completed by one step and to select the scheme. In the process, it should be noted that interdiffusion temperature (=the temperature at which interdiffusion appears and a modulated composite transfers to an amorphous state) is the same or lower than nucleation temperature (=the temperature at which nuclei appear in an amorphous state and are crystallized). Moreover, since a reaction process of the above described amorphous-nucleation is controlled by solid-phase reaction or solid-phase diffusion, it proceeds in almost the same way under a pressurized condition or under a condition below an atmospheric pressure such as under vacuum, as under an atmospheric pressure.

A method of the present invention can provide a thermodynamically metastable final product, or a product which has experienced a specific transition state that is difficult to achieve by a conventional metallurgical method. This point is a feature that is excellent as a method for producing a material of the present invention.

Important parameters in the amorphous-nucleation method for producing a thermoelectric material with a target composition and crystal structure include the thickness of each reactant layer and heat treatment temperature.

Each of the above described each reactant layers has a thickness of 20 nm or less, preferably 10 nm or less, more preferably 6 nm or less. When each reactant layer has a thickness exceeding 20 nm, in some combination of elements or under some heat treatment conditions, undesirably, an amorphous state is not induced, but a thermodynamically stable intermetallic compound directly appears at an interface through mutual diffusion reaction. When a thermoelectric material composed of three elements or more according to the present invention is produced, there are at least two combinations of adjacent reactant layers. Once a different compound appears at each interface, it takes time for these compounds to react with each other to form a homogeneous material. In some cases, a desired thermoelectric material may not be obtained. However, when each reactant layer has a thickness of 20 nm or less, preferably 10 nm or less, more preferably 6 nm or less, higher thermoelectric properties may be obtained in the case where those phases locally separated to two or more are regularly ordered as a whole to compose a metastable superlattice.

A modulated composite is laminated by determining the thickness of each reactant layer within a range of 20 nm or less so as to obtain a target composition. The thickness of each reactant layer can be controlled according to a known method in each of the above described methods for preparing thin films.

The thickness of a repeat unit prepared is measured by low-angle X-ray diffraction. The thickness of each reactant layer is determined by the thickness proportion of each reactant layer which is calculated by the mass density of each reactant layer and the composition of a modulated composite. Typical conditions for a measuring method of low-angle X-ray diffraction are as follows: use of CuKα line, slit width of ½ to 1°, scan speed of 1 to 4°/min, scan step of 0.01 to 0.04°, scan axis of 2θ/θ, and scan range of 2θ=0.5-80°. Incidentally, the thickness of each reactant layer can be directly measured by observing a cross section of a modulated composite with a transmission electron microscope (TEM) only when the thickness of each reactant layer exceeds 20 nm, and there is no way to know the proportion of the thickness of each reactant layer. However, when TEM is used, it is necessary to study sufficient numbers of fields of view that can sufficiently statistically typify the whole and average the results. It is necessary to measure three fields of view or more from typical sites of a thermoelectric material.

It is generally desirable to heat-treat the above described modulated composite in a temperature range of from 50° C. to 585° C. to cause each reactant layer to react, thereby finally forming an R—Bi—Te-based thermoelectric material with a rhombohedral main phase. When heat treatment temperature is less than 50° C., the duration of heat treatment is increased, resulting in poorer productivity. On the other hand, if it exceeds 585° C., phases of reactant preferentially form a thermodynamically stable phase with each other at each interface, and mainly rare earth elements segregate, resulting in reduction of a Seebeck coefficient and other thermoelectric properties.

Optimum duration of heat treatment varies with heat treatment temperature. A thermoelectric material of the present invention is a metastable material in a wide range of composition. Therefore, for example, if it is heat-treated for infinite time duration, it will be converted to a more stable mixture phase, even when the heat treatment is performed within a temperature range of from 50° C. to 585° C. Thus, it is preferable to stop heat treatment when the whole of a material is crystallized.

Moreover, the temperature increase rate and the temperature decrease rate are included in heat treatment conditions. Preferably, the temperature increase rate is controlled to a constant value in order to maintain reproducible production. The temperature increase is a step appearing in many production processes. In a heat treatment process, the temperature of a material is increased toward a specific temperature for the purpose of heat treating the material at the specific temperature for specific time duration. At this time, when the material enters into a temperature range of from 50° C. to 585° C., interdiffusion of an element in a reactant layer is started, and the material may attain an amorphous state before it reaches the specific temperature, depending on the composition of a modulated composite, a laminate structure and the temperature increase rate. In such a case, a very efficient reaction process can be designed by regarding the specific temperature as nucleation temperature and controlling the temperature increase rate.

In a material of the present invention, it is not easy to melt a rare earth element with a high melting point together with Bi and Te with a low melting point and a high vapor pressure without noticeable deviation of composition. For example, during arc melting, or when a material is melted and mixed using a tube furnace or a crucible furnace in an ordinary pressure and inactive atmosphere, a large part of Te with an especially high vapor pressure transpires to an open space and disappears from the material. When Yb with a high melting point is to be contained, or when a large amount of Ce with a relatively low melting point is to be contained, it is extremely difficult to complete the production while strictly controlling the composition, by using a melting method in which all elements are melted for chemical combination. When the temperature is increased up to 1,030° C. in order to sufficiently homogeneously melt a rare earth element and Te, the vapor pressure of Te increases up to 2 atm. For example, even when these are sealed in a silica tube for melting in order to suppress transpiration of Te, there will be a risk of the rupture of a container.

An amorphous-nucleation method as a production method for a thermoelectric material of the present invention can be used when a thermoelectric material that is particularly sensitive to a compositional change is to be produced, because the method does not require any heat treatment at a high temperature. In the amorphous-nucleation method, an R—Bi—Te crystalline material is produced through an amorphous phase by heat-treating the above described modulated composite at a temperature range of from 50° C. to 585° C., without melting it at a melting point of a rare earth element or higher. Moreover, in the amorphous-nucleation method, preferably, it is not necessary to use a raw material that is environmentally undesirable such as a chloride in hydrothermal synthesis.

The present invention provides a method for producing a thermoelectric material characterized by forming a thermoelectric material on a substrate and then separating the thermoelectric material from the substrate.

A method of dissolving a resin substrate into a solvent after forming a thin film on the substrate is preferred as a method of separation, since it gives the least damage to a material.

The present invention provides a method for producing a thermoelectric material, characterized by alloying a powder by a mechanical alloying method which comprises at least components (1) and (2) below and in which the total sum of the content of R, Bi and Te is 90 atomic % or more of the whole powder, and heating a resultant material in a temperature range of from 50° C. to 585° C., wherein component (1) comprises at least powder (A) containing Te and powder (B) containing R, and component (2) is a powder selected from the group consisting of a powder containing Bi in (A), a powder containing Bi in (B), a powder containing Bi in at least one powder selected from powers containing an element other than those in (A) and (B), and a powder containing only Bi.

A mechanical alloying method is a production method in which each reactant is chemically combined or makes a solid solution by mechanical energy.

Another method for producing a thermoelectric material of the present invention is a method in which a material alloyed by the above described method is heated in a temperature range of from 50° C. to 585° C. Since this method also does not melt and mix raw materials at a high temperature, the above described problems involved in chemical combination of a rare earth element having a high melting point with Te having a high vapor pressure can be avoided. In this method, a raw material powder corresponds to a reactant layer in the amorphous-nucleation method.

As specific materials, raw material powder (A) containing at least Te and raw material powder (B) containing at least R are used, and Bi may be or may not be contained in the raw material powder (A) and/or (B). However, when Bi is not contained, a powder containing only Bi and/or a powder having the composition containing Bi must be added as a raw material. A powder that contains none of the three elements of R, Bi and Te may be mixed.

Examples of combinations of raw material powders include:
 (i) Te powder (A), Ce—Bi powder (B);
 (ii) Te powder (A), Yb powder (B), Bi powder;
 (iii) Te—Bi powder and Te—Sb—Se powder (A), Ce—Bi powder and Sm powder (B);
 (iv) Te—Bi powder and Te—Sb powder (A), Ce—Sb powder (B), Sb powder;
 (v) Te—Se powder (A), Ce—Bi—Sb powder (B), Bi—Sb powder and Bi—Se powder;
 (vi) Te—Bi—Se powder(A), Sm—Yb powder, Sm—Bi powder, Sm—Sb powder, Sm—Bi—Sb powder, Yb—Bi powder, Yb—Sb powder, and Yb—Bi—Sb powder(B); and the like. In other words, a raw material powder may be composed of two types of powder (A) and (B) as in (i); and the three elements of R, Bi and Te may be contained in separate powders as in (ii). Moreover, Se and Sb may be contained, or R, Te and Bi each may be contained separately in two types of powder or more, as in (iii). A powder which contains none of R, Te and Bi may be mixed as in (iv). The important point is that R and Te are not contained in the same powder, and that a step of melting R and Te as a mixture thereof is not included in the steps starting from preparing raw materials to completing the production of a thermoelectric material.

Next, the sum of the content of R, Bi and Te contained in these repeat units must be 90 percent by mole or more of the whole repeat unit thereof, and the above described M component may be acceptable as remaining 10 percent by mole or less. Furthermore, 80 percent by mole of Bi may be replaced with Sb, and 50 percent by mole of Te may be replaced with Se.

A known apparatus, for example, a vibratory, rotary, or planetary ball mill or the like may be used in a mechanical alloying method. When a ball mill is used, the material of a pot and a milling-ball includes an inorganic substance such as metal such as stainless steel and iron, an oxide such as agate, alumina and zirconia, and the like. The production may be performed in a dry atmosphere such as in an inert gas, in hydrogen or under vacuum. The production may also be performed according to a wet method using an organic solvent such as a hydrocarbon-based solvent such as hexane and decane, acetone, methanol and ethanol. A raw material powder has a particle size of from 0.1 μm to 10,000 μm, and a milling-ball has a ball size of from 0.1 mm to 100 mm.

A material alloyed by a mechanical alloying method is amorphous, or is in the state of a microcrystal with much defects and low crystallinity. Heat treatment at a suitable temperature promotes crystallization in a material which is made amorphous by mechanical energy at a temperature for recrystallization, and can further crystallize the state of "a microcrystal with much defects and low crystallinity", which is a stage in which nuclei are appearing in an amorphous state. A mechanically alloyed material can be positioned in somewhere in the reaction path thereof by comparing the structure thereof with an intermediate material at each step through which a thermoelectric material is created by an amorphous-nucleation method. As in the case of an amorphous-nucleation method, it is possible to prepare thereby a metastable product, or a product which has experienced a specific transition state that is difficult to achieve by a conventional metallurgical method.

Accordingly, also in the case of producing a thermoelectric material of the present invention by a mechanical alloying method, it is preferred to undergo heat treatment in a temperature range of from 50° C. to 585° C. on the grounds similar to the case of an amorphous-nucleation method. As described above, since a mechanical alloying method is one of the methods for producing a thermoelectric material of the present invention, excellent thermoelectric properties are obtained when a thermoelectric material obtained by this method has crystallinity in which the grain size of a crystal is 1 μm or more, and the half-value width of a diffraction line by X-ray diffraction is 0.5° or less, more preferably that is 0.3° or less.

An example of processes for producing a thermoelectric material of the present invention by a mechanical alloying method includes a process of subjecting a raw material consisting of a ground powder of a Ce—Bi intermetallic compound prepared separately by a melting method, a Te powder and a Bi powder to mechanical alloying and heating the resultant material at 300° C. for 20 hours.

As described above, a mechanical alloying method allows a metastable material to be produced, similar to an amorphous-nucleation method, and in particular does not require high-temperature heat-treatment for producing a thermoelectric material sensitive to a compositional change, resulting in elimination of the deviation of composition or the like.

There are observed several differences between a material obtained by a mechanical alloying method and that obtained by an amorphous-nucleation method. By a mechanical alloying method, compared to an amorphous-nucleation method, (1) only a material with small alignment can be prepared; (2) it is difficult to form a thin film; and (3) it is difficult to form a continuous body on a resin substrate etc. Especially, influence of (1) to thermoelectric properties is noticeable. A material of the present invention has a rhombohedral crystal system, and application of an amorphous-nucleation method often allows production of a material having the uniaxial direction aligned with the perpendicular direction of a substrate surface. Therefore, not only a material used for thin film but also a material obtained by separating this material from the substrate and grinding it is often brought into a flat filler-like state in which the uniaxial direction of a crystal is perpendicular to the plane. When this material is shaped by a uniaxial compression machine in which the material is constrained at top and bottom surfaces only or at four sides, the in-plane direction that has high thermoelectric properties can be aligned in the direction perpendicular to the direction of uniaxial compression, thereby achieving desirable thermoelectric properties.

The difference of the methodology of a mechanical alloying method and an amorphous-nucleation method will be described below, although it may be conceptual. In a mechanical alloying method, when two milling-balls collide, different types of materials that are accidentally present between the balls are mixed while being stretched to thinner shapes by the kinetic energy of the milling-balls, and are gradually alloyed while this process is repeated. Thus, since materials are alloyed by accidental events, both composition and structure are statistically distributed. This method is, so to speak, an indeterministic production method. On the other hand, in an amorphous-nucleation method, it is possible to sufficiently control the film thickness of each reactant layer for lamination. Both composition and structure of a final compound obtained by heat-treating the laminate tend to be homogeneous. A target compound is securely produced by laminating reactant layers in a visible form and controlling conditions of heat treatment. Thus, an amorphous-nucleation method may be said to be one of deterministic methods.

The present invention also provides a method for sintering a thermoelectric material separated from a substrate, which is a thermoelectric material obtained by an amorphous-nucleation method, or a thermoelectric material obtained by a mechanical alloying method, in a temperature range of from 50° C. to 585° C. As described herein "sintering" means a method for producing a thermoelectric material, in which a thermoelectric material or a raw material thereof is pressurized and shaped before heat treatment, or heat treated while being pressurized, causing bond between materials to form a shaped product as a whole. When a sintering temperature is below 50° C., the time duration of sintering will be increased, reducing productivity. On the other hand, when it exceeds 585° C., a main phase is melted, or Te is lost from the system by sublimation, reducing a Seebeck coefficient and other thermoelectric properties. A method of sintering includes a conventionally used method such as a normal-pressure sintering method, hot pressing, HIP (hot isostatic pressing), or a pressure sintering method such as SPS (spark plasma sintering). The sintering is performed in an atmosphere of reducing gas, inert gas or vacuum. A thermoelectric material with increased density containing no pore can be produced by a method of hot pressing in a vacuum atmosphere for one minute or more during pressurized heat treatment. This material is a thermoelectric material excellent in impact resistance and heat-distortion resistance.

The present invention provides a method for producing a thermoelectric material, characterized by sintering a modulated composite formed on a substrate surface in a temperature range of from 50° C. to 585° C. to allow a reactant layer to react, wherein the modulated composite comprises at least two repeat units; each repeat unit comprises at least two laminated reactant layers; each repeat unit contains R, Bi and Te, wherein the total sum of the content of R, Bi and Te is 90 percent by mole or more of the whole repeat unit; and each reactant layer has a thickness of from more than 0 nm to 20 nm.

When a material with a substrate prepared by an amorphous-nucleation method is applied as a bulk thermoelectric material, a heat treatment process before sintering, in which a modulated composite of the present invention is heated in a temperature range of from 50° C. to 585° C. to allow a reactant layer to react, may be omitted, if the heating for sintering is performed under an optimum condition. Such a production method can be selected by the following reason. Since a reaction process of amorphous-nucleation is controlled by solid-phase reaction or solid-phase diffusion, it proceeds in almost the same way under a pressurized condition as under an atmospheric pressure. Accordingly, for some composition and structure of a modulated composite, it is possible to simultaneously control a sintering process for heating a material to solidify the same and an amorphous-nucleation reaction which proceeds by the heating. An example of an embodiment of a thermoelectric material which can be prepared by this production method includes a configuration shown in FIG. 8. Moreover, a production method including composition and structure of a material, other than the steps of not separating a thermoelectric material of the present invention from a substrate and heating the material are each included one time in total, is as described above in detail.

The present invention provides a method for producing a thermoelectric material, characterized by separating a modulated composite, which is formed on a substrate surface, from the substrate, and sintering the modulated composite in a temperature range of from 50° C. to 585° C. to allow a reactant layer to react, wherein the modulated composite comprises at least two repeat units; each repeat unit comprises at least two laminated reactant layers; each repeat unit contains R, Bi and Te, wherein the total sum of the content of R, Bi and Te is 90 percent by mole or more of the whole repeat unit; and each reactant layer has a thickness of from more than 0 nm to 20 nm.

Amorphous-nucleation and sintering can be simultaneously performed by sintering a material separated from a substrate in a temperature range of from 50° C. to 585° C. without performing heat treatment of a modulated composite of the present invention. Accordingly, a heat treatment process for allowing a reactant layer to react on a substrate can be omitted. In Example 10, heat treatment is performed while a thermoelectric material is on a substrate to form a thermoelectric material of the present invention, before separating the thermoelectric material from the substrate to sinter the same. Also, amorphous-nucleation and sintering can be simultaneously performed in the manner almost the same as described in Example 10, by sintering a material separated from a substrate without performing heat treatment on a substrate. In this case, if a sintering temperature is set at the same value, it is preferable that the sintering time be increased by 20% to 200% compared to the case in Example 10. Moreover, a production method including composition and structure of a material, other than the step of heating the material is included one time in total, is as described above in detail.

The present invention provides a method for producing a thermoelectric material, characterized by alloying a powder by a mechanical alloying method which comprises at least components (1) and (2) below and in which the total sum of the content of R, Bi and Te is 90 percent by mole or more of the whole powder, and sintering a resultant material in a temperature range of from 50° C. to 585° C., wherein component (1) comprises powder (A) containing at least Te and powder (B) containing at least R, and component (2) is a powder selected from the group consisting of a powder containing Bi in (A), a powder containing Bi in (B), a powder containing Bi in at least one powder selected from powers containing an element other than those in (A) and (B), and a powder containing only Bi.

According to this method, a material alloyed by a mechanical alloying method of the present invention is sintered at a temperature of from 50° C. to 585° C. while being crystallized.

One of the features of a production method of the present invention is that a metastable material can be produced as a final product. When Ce is selected as a rare earth element, it is known from a paper (P. G. Rustamov et. al., Zhurnal Neorganicheskoi Khimii, (1979), 24 (3), 764-766) that, in a thermodynamically stable phase, the upper limit of the solid solubility of $Ce_2Te_3$ to $Bi_2Te_3$ is 3% by mole ($=Ce_{1.2}Bi_{38.8}Te_{60}$) at room temperature. However, as apparent from Examples in the present specification, Ce exists in the present thermoelectric material in a homogeneous state, even if the content of Ce exceeds 1.2 percent by mole of the whole repeat unit.

Therefore, according to a production method of the present invention, a homogeneous material can be obtained in which a main phase has a rhombohedral crystal structure, even if the composition is selected in which the main phase has a metastable state.

As described above, the form of a thermoelectric material of the present invention includes the following:
(i) a thin film-like thermoelectric material formed on a substrate including a resin substrate,
(ii) a thin film-like thermoelectric material separated from a substrate,
(iii) a powder-like thermoelectric material, and
(iv) a thermoelectric material prepared by sintering each of the materials in (i) to (iii) above described.

In the above described (iv), a thermoelectric material prepared by sintering (ii) or (iii) includes a thermoelectric material subjected to pressure sintering in Example 10 as described below, and a thermoelectric material prepared by sintering a powder prepared by a mechanical alloying method as described in the above specification. An embodiment of a material prepared by sintering (i) includes a thermoelectric material as shown in FIG. 8.

All forms as described in (i) to (iv) can be one form of a thermoelectric material which is responsible for power generation and heat transfer by electric current, and it is utilized as an excellent thermoelectric element by attaching an electrode, an insulating plate or the like to it.

DETAILED DESCRIPTION

Figure 1:
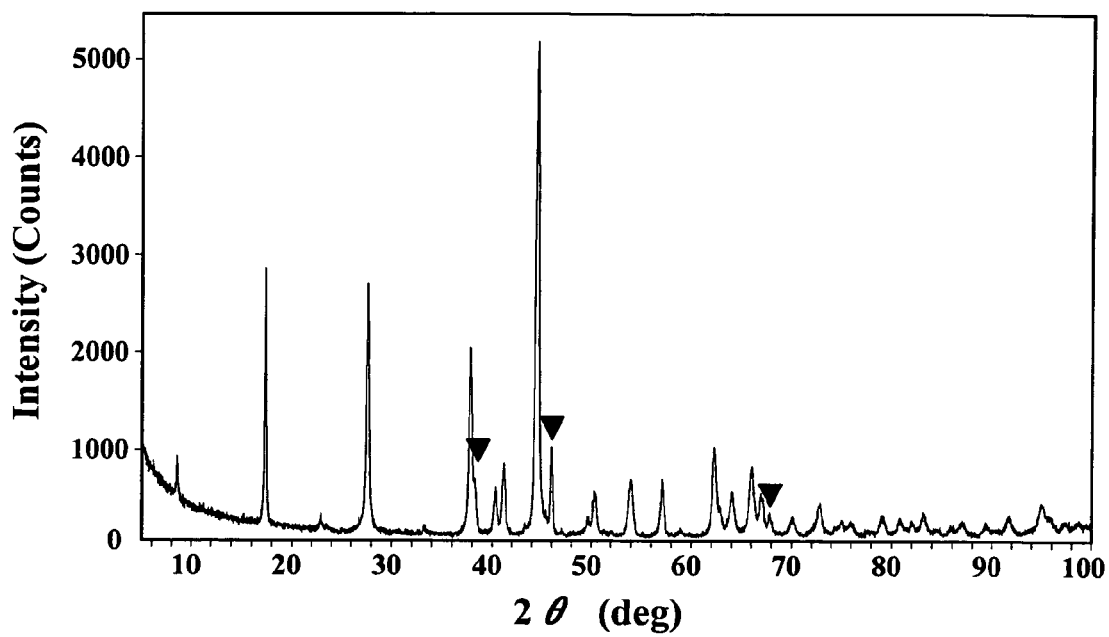
FIG. 1 shows X-ray diffraction patterns (Cu—Kα) of $Ce_{0.1}Bi_2Te_{5.3}$ ($=Ce_{1.4}Bi_{27.0}Te_{71.6}$) in Example 7, in which the symbol ∇ indicates a diffraction line for a Te sub-phase.

Disclosed below are representative methods and apparatus. The disclosed methods should not be construed as limiting in any way. Instead, the present disclosure is directed toward novel and nonobvious features and aspects of the various disclosed embodiments, alone and in various combinations and subcombinations with one another. The methods and apparatus are not limited to any specific aspects or features, or combinations thereof, nor do the methods and apparatus require that any one or more specific advantages be present or problems be solved.

Although the operations of the disclosed methods and apparatus are described in a particular, sequential order for convenient presentation, it should be understood that this manner of description encompasses rearrangement, unless a particular ordering is required by specific language set forth below. For example, operations described sequentially may in some cases be rearranged or performed concurrently. Additionally, the detailed description sometimes uses terms like "determine" and "provide" to describe the disclosed methods. These terms are high-level abstractions of the actual operations that are performed. The actual operations that correspond to these terms will vary depending on the particular implementation and are readily discernible by one of ordinary skill in the art.

Compositions are described herein with reference to percent composition by mole or, equivalently, percent atomic composition.

Thermoelectric Material Evaluation Methods (1) Thermoelectric Properties

A Seebeck coefficient ($\alpha$) was determined by a $\Delta T$ method, wherein $\Delta T$ was set at 5° C. or less. Electrical conductivity ($\sigma$) was determined by the four-terminal method, and thermal conductivity ($\kappa$) was determined by a steady-state method.

(2) Average Grain Size of Crystal

A scanning electron microscope was used to measure ten powders in each of three fields of view for determining an average grain size of crystals according to the method as described above.

(3) Index of Alignment

X-ray diffraction was measured by using the CuK$\alpha$ line. Conditions for the measurement are as follows: voltage/current of 40 kV/200 mA, divergence slit of 1°, scattering slit of 1°, receiving slit of 0.15 mm, scan speed of 2°/min, scan step of 0.02°, scan axis of 2θ/θ, and scan range of 2θ=5-100°.

An index of alignment A is determined by the calculation using the expression:

$$A = I(222)/I(-110)$$

wherein I(222) denotes the intensity in counts per second (CPS) from a base line for the diffraction line of index (222), and I(-111) denotes the intensity (CPS) from a base line for the diffraction line of index (-110).

(4) Half-Value Width of X-Ray Diffraction Line

A half-value width of a diffraction line obtained by X-ray diffraction was obtained from X-ray diffraction patterns measured under the conditions as in (3).

EXAMPLES 1 TO 9 AND COMPARATIVE EXAMPLES 1 TO 4

Nine types of composition of Ce—Bi—Te-based modulated composites having a thickness of from 50 to 70 nm as a whole were prepared (Examples 1 to 9) by alternately evaporating and laminating Bi in a thickness of from 2.0 nm to 4.0 nm, Te in a thickness of from 4.8 nm to 9.5 nm, and Ce in a thickness of from 0.3 nm to 0.5 nm on a silicon wafer with a PMMA layer spin-coated in a thickness of about 0.4 μm, while maintaining a degree of vacuum of $1 \times 10^{-7}$ Torr in the inside of a vacuum chamber provided with deposition sources which can be controlled independently. A low-angle X-ray diffraction of 2θ=1-3° for these materials was measured. As a result, a regularly modulated peak was observed corresponding to the thickness of each repeat unit. Thus, the material was found to be a film in which Ce, Bi and Te are regularly aligned.

The temperature of above composition-modulated composite was increased by 100° C./min. Then, it was heat-treated at 300° C. for 40 hours under a nitrogen atmosphere. In all Examples, it was possible to obtain $Ce_{0.1}Bi_2Te_3$-based thermoelectric materials in which a main phase has a rhombohedral crystal structure. The lattice constants thereof were within a range of a=1.030 nm to 1.048 nm and $\alpha$=20.7° to 24.5°.

It is considered that the above described composition-modulated composites were once in an amorphous state, and then recrystallized to form final products.

FIG. 1 shows X-ray diffraction patterns (Cu-Ka) of $Ce_{0.1}Bi_2Te_{5.3}$ ($Ce_{1.4}Bi_{27.0}Te_{71.6}$), which was prepared by separating the thermoelectric material from a substrate by dissolving PMMA with acetone, in Example 7. The symbol ∇ indicates a diffraction line for a Te sub-phase, and a single phase of Ce or an oxide layer thereof was not observed. The above X-ray diffraction and electron microprobe analysis (EPMA analysis) showed that this thermoelectric material contained a Te sub-phase in about 6% by volume, and that Ce was homogeneously contained in a main phase having a rhombohedral crystal structure. Moreover, each diffraction line in FIG. 1 was very sharp with a half-value width of 0.5° or less, and the strongest line had a half-value width of about 0.2°. It was found that the present thermoelectric material was a material with a high crystallinity.

Figure 7:
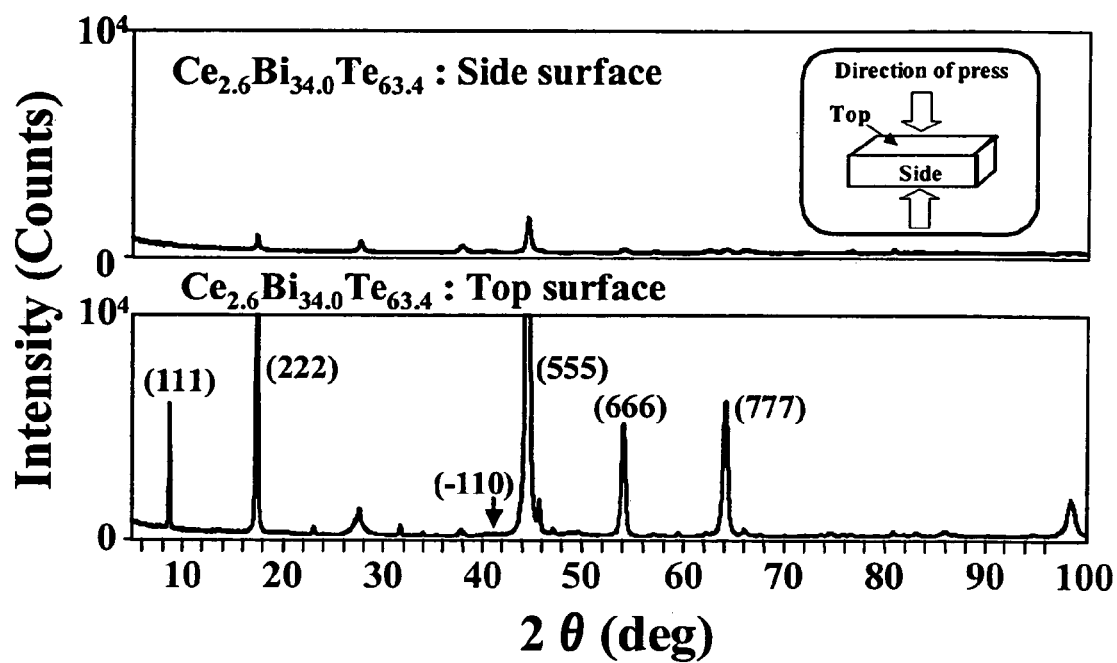
FIG. 7 shows X-ray diffraction patterns of the direction of uniaxial compression (Side surface) and the direction perpendicular to it (Top surface) of a $Ce_{2.6}Bi_{34.0}Te_{63.4}$ sintered compact, in which in the upper right-hand corner of the figure, each of the surfaces measured is shown as an easy-to-understand illustration.
Figure 8:
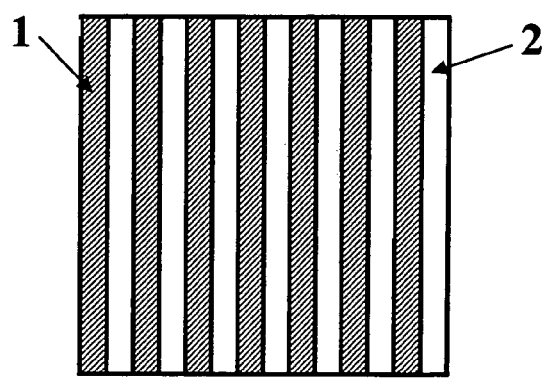
FIG. 8 shows an embodiment of a thermoelectric material of the present invention, in which 1 denotes a thermoelectric material, and 2 denotes a resin substrate.

In other examples also, the values of a half-value width were the same as shown in FIG. 7, which means that these do not belong to a category generally recognized as an amorphous phase or a microcrystalline phase. Moreover, these materials had crystals with an average grain size of sufficiently exceeding 1 μm, and the index of alignment A was infinite for all of the materials.

Figure 2:
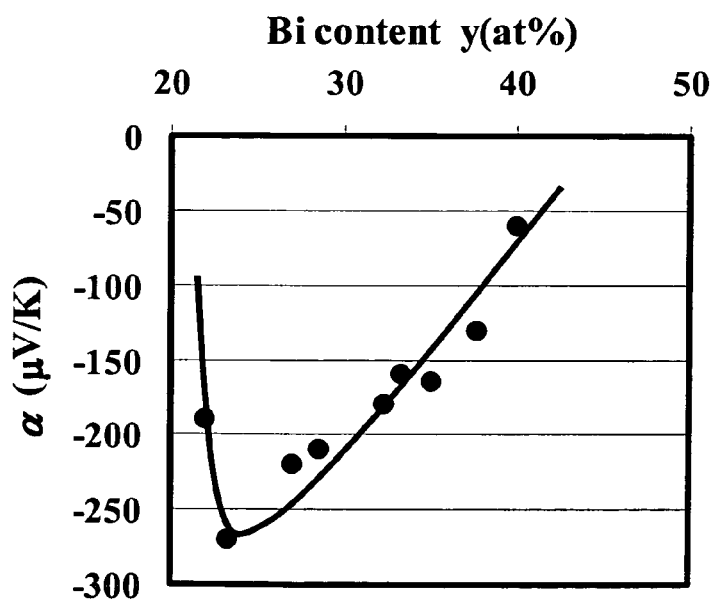
FIG. 2 shows a relationship of a Bi content y (percent by mole) for $Ce_{0.1}Bi_2Te_2$ material in Examples 1 to 9 to a Seebeck coefficient (α) at room temperature.
Figure 3:
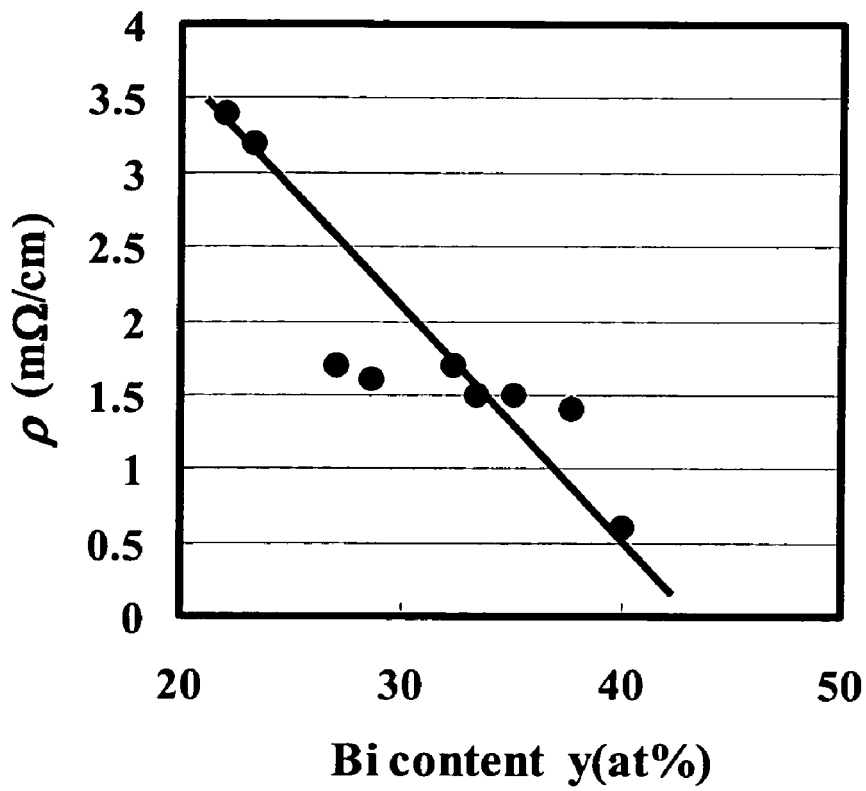
FIG. 3 shows a relationship of a Bi content y (percent by mole) for $Ce_{0.1}Bi_2Te_2$ material in Examples 1 to 9 to electrical resistivity (ρ) at room temperature.
Figure 4:
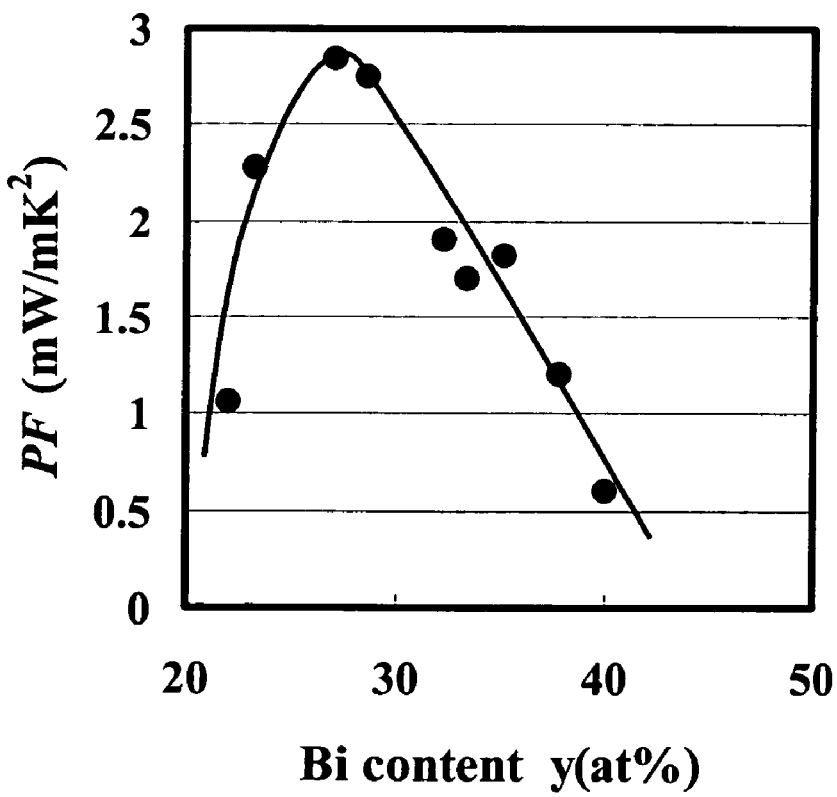
FIG. 4 shows a relationship of a Bi content y (percent by mole) for $Ce_{0.1}Bi_2Te_2$ material in Examples 1 to 9 to a power factor (PF) at room temperature.

FIGS. 2, 3 and 4 show a relationship of a Bi content y (percent by mole) for $Ce_{0.1}Bi_2Te_x$ material on the horizontal axis to a Seebeck coefficient ($\alpha$) at room temperature, electrical resistivity ($\rho$) at room temperature, and power factor (PF) at room temperature, respectively, on the vertical axis. Incidentally, these data were obtained by the measurement of the material without separating it from a substrate.

The absolute value of a Seebeck coefficient ($\alpha$) was 50 μV/K or more at a Bi content of from 21 to 40 percent by mole. PF was the highest at 27 percent by mole, where the value of PF was 2.8 mW/mK$^2$ and a Seebeck coefficient ($\alpha$) was -220 μV/K.

Table 1 summarizes the composition and thermoelectric properties shown in FIGS. 2 to 4. In addition, in Table 1, there are also shown thermoelectric properties of thermoelectric materials having four types of composition prepared in the same manner as in Examples 1 to 9 except that Ce is not added (Comparative Examples 1 to 4).

TABLE 1

|  | z | Ce content x (atomic %) | Bi content y (atomic %) | Seebeck coefficient α (μV/K) | Electrical resistivity ρ (mΩ cm) | Power factor PF (mW/mK$^2$) |
| --- | --- | --- | --- | --- | --- | --- |
| Example 1 | 2.9 | 2.0 | 40.0 | −60 | 0.6 | 0.6 |
| Example 2 | 3.2 | 1.9 | 37.7 | −130 | 1.4 | 1.2 |
| Comparative Example 1 | 3.2 | 0 | 38.5 | −130 | 2.0 | 0.8 |
| Example 3 | 3.6 | 1.8 | 35.1 | −165 | 1.5 | 1.8 |
| Example 4 | 3.9 | 1.7 | 33.3 | −160 | 1.5 | 1.7 |
| Example 5 | 4.1 | 1.6 | 32.3 | −180 | 1.7 | 1.9 |
| Comparative Example 2 | 4.4 | 0 | 31.3 | −190 | 2.3 | 1.6 |
| Example 6 | 4.9 | 1.4 | 28.6 | −210 | 1.6 | 2.8 |
| Example 7 | 5.3 | 1.4 | 27.0 | −220 | 1.7 | 2.8 |
| Comparative Example 3 | 5.2 | 0 | 27.8 | −190 | 3.9 | 0.9 |
| Comparative Example 4 | 5.9 | 0 | 25.3 | −190 | 3.2 | 1.1 |
| Example 8 | 6.5 | 1.2 | 23.3 | −270 | 3.2 | 2.3 |
| Example 9 | 7 | 1.1 | 22.0 | −190 | 3.4 | 1.1 |

Example $Ce_{0.1}Bi_2Te_z$

Comparative Example $Bi_2Te_z$

Within a range shown in Table 1, when comparing Examples to Comparative Examples having a similar ratio of the composition of Bi—Te, those materials in which Ce is added show higher thermoelectric properties in general.

EXAMPLE 10

Figure 5:
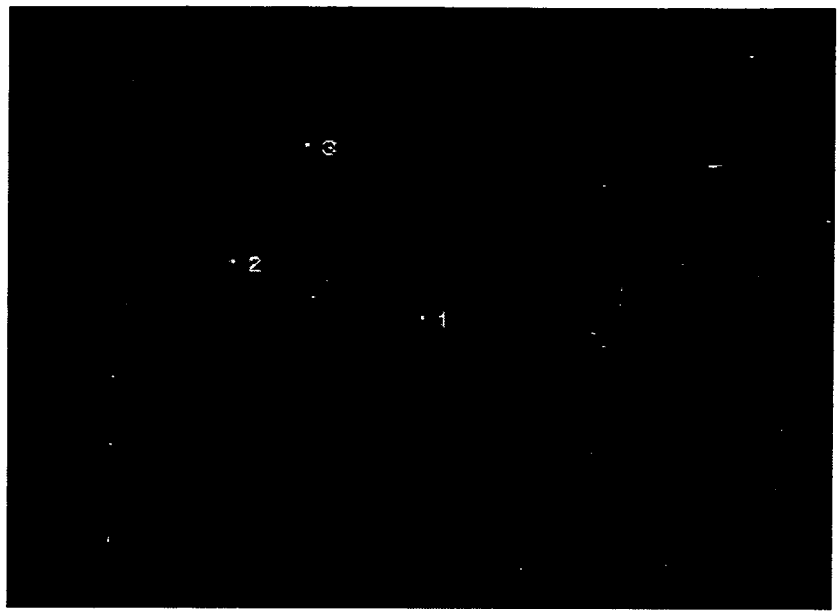
FIG. 5 is an electron micrograph of a filler-like Ce—Bi—Te-based thermoelectric material used in Example 10.

A Ce—Bi—Te-based material obtained in the same manner as in Examples 1 to 9 was separated from a substrate to obtain about 0.13 g of filler. FIG. 5 is an electron micrograph of this filler-like material. Most of the powders supplied to the present example had a grain size in a range of from 5 to 100 μm and an average grain size of 50 μm. This filler-like Ce—Bi—Te-based material was charged into a hard metal mold of 2 mm×8 mm, and subjected to hot pressing using a uniaxial press machine under a condition of 300° C. under vacuum, 700 MPa and 10 hours.

Figure 6:
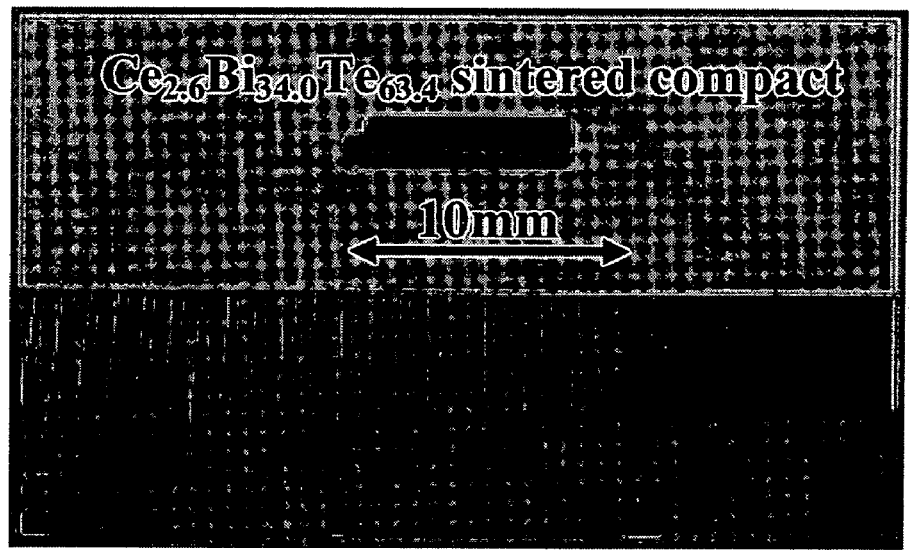
FIG. 6 is a photograph showing an appearance of a sintered compact prepared by hot pressing in Example 10.

An appearance of a resultant sintered compact is shown in FIG. 6. It has a dimension of 2.0 mm×8.0 mm×1.1 mm, and the direction of uniaxial compression is in the direction of a thickness of 1.1 mm. Incidentally, it had a density of 7.3 and a composition of $Ce_{2.6}Bi_{34.0}Te_{63.4}$ as determined by EPMA. X-ray diffraction patterns for two surfaces selected from six surfaces of this material are shown in FIG. 7. As apparent from the comparison of X-ray diffraction patterns of a surface in the direction perpendicular to the direction of uniaxial compression (top surface) to those of a surface in the direction parallel to it (side surface), the in-plane direction is well aligned with the longitudinal direction (the direction perpendicular to the direction of uniaxial compression) of a material. The index of alignment A [=I(222)/I(−110)] is 269 for the top surface and 7.8 for the side surface. Moreover, from a power pattern of a raw material of the present invention, it was found that a main phase had a rhombohedral crystal structure, the lattice constant thereof being a=1.0459 nm and α=24.17°. The index of alignment A of a raw material powder obtained from a powder pattern was 4.7. Moreover, each diffraction line was very sharp with a half-value width of 0.5° or less, and the strongest line had a half-value width of 0.3° or less. Thus, it is apparent that the present thermoelectric material is a material with a high crystallinity. The position of diffraction lines for (222) and (−110) was 17.5° and 41.3° in 2θ, respectively.

As described above, a specific surface, such as the top surface, has a high alignment, and raw material fillers had an average grain size of 50 μm. Thus, it is apparent that this material has crystals with an average grain size of about 50 μm, and that this material is, therefore, a thermoelectric material sufficiently satisfying a range of average grain size of crystals of 1 μm or more that is a scope of the present invention.

The thermoelectric properties of this material at room temperature were as follows: a Seebeck coefficient α=−132 μV/K, electrical resistivity ρ=1.4 mΩ cm, a power factor PF=1.2 mW/mK$^2$, thermal conductivity κ=2.2 W/mK, and a dimensionless figure of merit ZT=0.2.

Moreover, even when this sintered-compact thermoelectric material was allowed to fall on a concrete surface from the height of 1.5 m, no cracking and chipping appeared, showing superior impact resistance compared to a $Bi_2Te_3$-based single-crystal thermoelectric material. Since a thermoelectric material of the present invention is a polycrystal with a high alignment comparable to a single crystal, high impact resistance has been achieved in addition to satisfactory thermoelectric properties for some applications.

EXAMPLES 11 TO 13 AND COMPARATIVE EXAMPLE 5

R—Bi—Te-based thermoelectric materials were obtained in which a main phase has a rhombohedral crystal structure, in the same manner as in Examples 1 to 9, except that the ratio of the composition of Ce, Bi and Te and heat-treatment conditions were different. Table 2 shows the ratio of composition, heat-treatment conditions, and thermoelectric properties. The absolute values of a Seebeck coefficient α for all materials exceeded 50 μV/K. These materials were each evaporated on a silicon wafer substrate, and thermoelectric properties were measured in a state where each of the materials was on a substrate. Moreover, EPMA analysis of these materials showed that Ce was homogeneously dissolved in a solid solution of the present material. Each of the diffraction lines in all Examples had a half-value width of 0.5° or less, and each of the strongest lines had a half-value width of 0.3° or less. These materials had crystals with an average grain size of 1 μm or more, and the index of alignment was infinite.

TABLE 2

| | Ce content x (atomic %) | Bi content y (atomic %) | Te content 100 − x − y (atomic %) | Heat treatment condition | Seebeck coefficient α (μV/K) | Electrical resistivity ρ (mΩ cm) |
|---|---|---|---|---|---|---|
| Example 10 | 9.3 | 29.0 | 61.7 | 335° C./36 hr | −1000 | 42 |
| Example 11 | 13.1 | 26.6 | 60.3 | 300° C./2 hr | −100 | 50 |
| Example 12 | 17.1 | 23.2 | 59.7 | 335° C./36 hr | −60 | 120 |
| Example 13 | 18.3 | 21.6 | 60.1 | 300° C./2 hr | −88 | 22 |
| Comparative Example 5 | 21.0 | 19.2 | 59.8 | 335° C./36 hr | 0 | 130 |

When the ratio of the composition of Ce exceeds 20 percent by mole, a rhombohedral crystal structure is distorted, resulting in reduction of thermoelectric properties. An example in which a Seebeck coefficient becomes zero in the above described range of the composition is shown in Table 2 as Comparative Example 5. In Comparative Example 5, a Bi content is less than 20 percent by mole.

EXAMPLES 14 TO 16

R—Bi—Te-based thermoelectric materials were obtained in which a main phase has a rhombohedral crystal structure, in the same manner as in Examples 11 to 13, except that the ratio of the composition of Yb, Bi and Te and heat-treatment conditions were as shown in Table 3. Table 3 shows thermoelectric properties thereof. The absolute values of a Seebeck coefficient a for all materials exceeded 50 μV/K. These materials were each deposited on a silicon wafer substrate, and thermoelectric properties were measured in a state where each of the materials was on a substrate. Moreover, EPMA analysis of these materials showed that Ce was homogeneously dissolved in a solid solution of the present material. Each of the diffraction lines in all Examples had a half-value width of 0.5° or less, and each of the strongest lines had a half-value width of 0.3° or less. These materials had crystals with an average grain size of 1 μm or more, and the index of alignment was infinite.

TABLE 3

| | Yb content x (atomic %) | Bi content y (atomic %) | Te content 100 − x − y (atomic %) | Heat treatment condition | Seebeck coefficient α (μV/K) | Electrical resistivity ρ (mΩ cm) |
|---|---|---|---|---|---|---|
| Example 14 | 16.9 | 67.4 | 15.7 | 335° C./36 hr | −100 | 1.6 |
| Example 15 | 15.4 | 69.8 | 14.8 | 335° C./36 hr | −60 | 0.6 |
| Example 16 | 14.8 | 70.9 | 14.4 | 335° C./36 hr | −63 | 0.7 |

As described above, thermoelectric materials with effective Seebeck coefficients (α) and large power factors (PFs) are provided. Such materials offer excellent thermoelectric performance, and can be formed so as to exhibit impact resistance and reduced heat-distortion. While several examples are described, the disclosure should not be taken as limiting, and we claim all that is encompassed by the appended claims.

The invention claimed is:

1. A thermoelectric material according to the formula $R_xBi_{y(1-b)}Te_{(100-x-y)(1-a)}Se_{a(100-x-y)}Sb_{yb}$, wherein R includes at least one element selected from a group consisting of Ce, Sm, and Yb, x, y, a, and b satisfy the expressions $0.05 \leq x < 20$, $20 \leq y \leq 75$, $0 \leq a \leq 0.5$, $0 \leq b \leq 0.8$, and further wherein a main phase of the thermoelectric material has a rhombohedral crystal structure.

2. The thermoelectric material of claim 1, wherein a=0.

3. The thermoelectric material of claim 2, wherein an average crystal grain size is greater than about 1 μm.

4. The thermoelectric material of claim 1, wherein b=0.

5. The thermoelectric material of claim 4, wherein an average crystal grain size is greater than about 1 μm.

6. The thermoelectric material of claim 1, according to the formula $R_xBi_{y(1-b)}Te_{(100-x-y)(1-a)}Se_{a(100-x-y)}Sb_{yb}$, wherein a=0 and b=0.

7. The thermoelectric material of claim 6, wherein an average crystal grain size is greater than about 1 μm.

8. The thermoelectric material of claim 1, wherein an average crystal grain size is greater than about 1 μm.

9. The thermoelectric material of claim 1, wherein at least one crystal phase has a strongest X-ray diffraction line having a width at half maximum of less than about 0.5°.

10. The thermoelectric material of claim 1, wherein an index of alignment A=I(222)/I(−110) is at least about 10, wherein I(222) and I(−110) are relative diffraction intensities with respect to associated baseline intensities for X-ray diffraction associated with indices (222) and (−110), respectively.

11. A thermoelectric film comprising the thermoelectric material of claim 1, where the film has a thickness between about 0.01 μm and 500 μm.

12. The thermoelectric film of claim 11, further comprising a resin substrate, and the thermoelectric film is situated on the resin substrate.

* * * * *